(12) United States Patent
Deka et al.

(10) Patent No.: US 11,742,754 B2
(45) Date of Patent: Aug. 29, 2023

(54) ENHANCED CONSTANT-ON-TIME BUCK INTELLECTUAL PROPERTY APPARATUS AND METHOD

(71) Applicant: Intel Corporation, Santa Clara, CA (US)

(72) Inventors: Anup J Deka, Bangalore (IN); Shobhit Tyagi, Ghaziabad (IN); Sudhir Polarouthu, Bangaluru (IN); Biranchinath Sahu, Bangaluru (IN)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 17/069,771

(22) Filed: Oct. 13, 2020

(65) Prior Publication Data
US 2021/0124382 A1 Apr. 29, 2021

Related U.S. Application Data

(60) Provisional application No. 62/926,325, filed on Oct. 25, 2019.

(51) Int. Cl.
| | | |
|---|---|---|
| *H02M 3/158* | (2006.01) | |
| *H02M 3/156* | (2006.01) | |
| *G05F 1/56* | (2006.01) | |
| *G05F 1/46* | (2006.01) | |
| *G06F 15/78* | (2006.01) | |
| *H03C 1/54* | (2006.01) | |

(52) U.S. Cl.
CPC ............ *H02M 3/158* (2013.01); *G05F 1/461* (2013.01); *G05F 1/56* (2013.01); *G06F 15/7807* (2013.01); *H02M 3/1566* (2021.05); *H03C 1/547* (2013.01)

(58) Field of Classification Search
CPC ..... H02M 3/1566–158; H02M 1/0025; H02M 1/08
See application file for complete search history.

(56) References Cited

U.S. PATENT DOCUMENTS

| | | | | |
|---|---|---|---|---|
| 9,941,791 | B1 * | 4/2018 | Goenawan | H02M 3/156 |
| 10,298,127 | B2 * | 5/2019 | Thiele | H02M 3/06 |
| 2017/0133927 | A1 * | 5/2017 | Almukhtar | H02M 3/156 |
| 2018/0048232 | A1 * | 2/2018 | Adell | H02M 3/158 |
| 2018/0351452 | A1 * | 12/2018 | Clavette | H02M 3/158 |
| 2021/0313887 | A1 * | 10/2021 | Mariani | H02M 3/158 |

(Continued)

FOREIGN PATENT DOCUMENTS

| | | | |
|---|---|---|---|
| CN | 204131395 U | * | 1/2015 |
| CN | 106487222 B | * | 12/2018 |

(Continued)

OTHER PUBLICATIONS

English translation of CN-204131395 Yang "Control Circuit For Switch Converter" Jan. 28, 2015 (Year: 2015).*

*Primary Examiner* — Sisay G Tiku
(74) *Attorney, Agent, or Firm* — Schwabe, Williamson & Wyatt, P.C.

(57) ABSTRACT

A one-shot inductor current scheme which includes a controller to generate a signal to control a high-side switch and a low-side switch such that the high-side switch remains turned on beyond a turn-on time if a voltage level on an output supply rail remains below a reference. The scheme reduces the minimum operating voltage Vmin and/or frequency guard-band of the SoCs (system-on-chips).

20 Claims, 12 Drawing Sheets

(56) References Cited

U.S. PATENT DOCUMENTS

2021/0351697 A1* 11/2021 Tyagi ..................... H03K 5/24
2022/0069810 A1* 3/2022 Desai .................... H03K 3/037
2022/0197842 A1* 6/2022 Regupathy ............ G06F 13/385

FOREIGN PATENT DOCUMENTS

EP         3534518 A1 *  9/2019  ............. G05F 1/468
EP         3588761 A1 *  1/2020  ............. H02M 1/00
EP         3902130 A1 * 10/2021  ............. G05F 1/462

* cited by examiner

ENHANCED CONSTANT-ON-TIME BUCK INTELLECTUAL PROPERTY APPARATUS AND METHOD

CLAIM OF PRIORITY

This application claims priority of U.S. Provisional Patent Application No. 62/926,325, filed Oct. 25, 2019, and titled "APPARATUS AND METHOD FOR ENHANCED CONSTANT-ON-TIME BUCK INTELLECTUAL PROPERTY FOR PROCESSOR POWER PERFORMANCE IMPROVEMENT AND SMALLER FORM FACTOR ENABLEMENT," which is incorporated by reference.

BACKGROUND

Switching voltage regulators (VR) are used to power up different voltage rails on SoCs (system-on-chips). A VR is desired to have high DC accuracy and minimal voltage droops during load transients (e.g., voltage and frequency changes). DC inaccuracy and voltage droops are accounted for through frequency guard-banding of processor cores resulting in sub-optimal power-performance and consequently, lower average selling price (ASP) of processor products.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
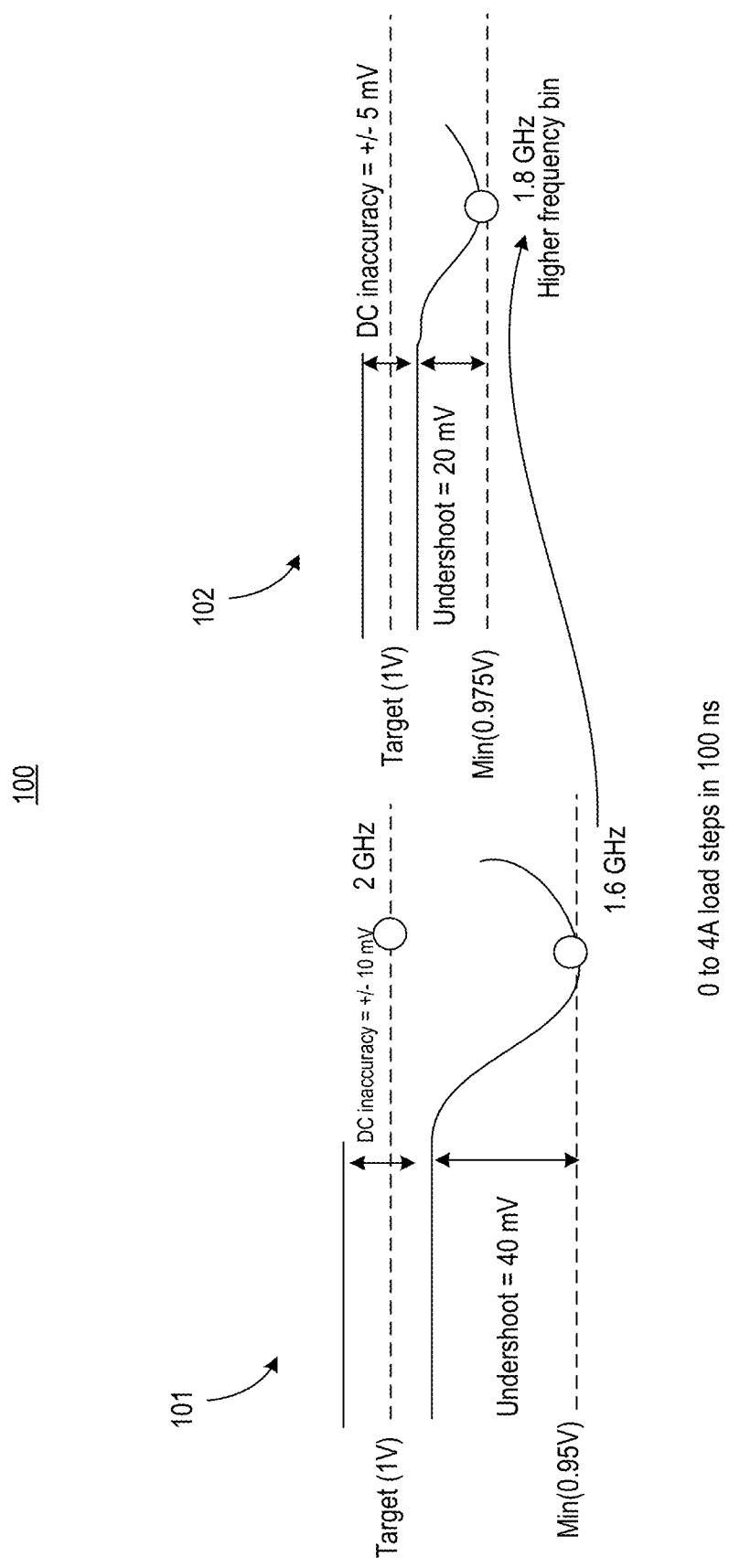
FIG. 1 illustrates a set of plots showing VR DC inaccuracy and undershoot and impact to processor core frequency.

PMICs (power management integrated circuit) and IVRs (integrated voltage regulators) have traditionally used fixed frequency Pulse Width Modulation (PWM) controller. When there is a sudden load transient, an output capacitor of the IVR provides instantaneous load current to the load (e.g., processor core, cache, I/O, etc.). In doing so, the output capacitor gets depleted of charges and the output voltage droops. The amount of droop depends on how fast a controller of the IVR responds and depletes the charges from the output capacitor. In fixed frequency controllers, the controller has to wait until the start of the next switching clock cycle before it starts replenishing the charges on the output capacitor and the latency in response results in a larger droop on the output voltage supply.

To improve the load transients, industry-leading PMICs are using hysteretic Constant-On Time (COT) Controllers that may react instantaneously. In a COT controller, the output capacitor is charged for a fixed ON time ($T_{ON}$) whenever an output voltage on the output supply rail falls below a reference (Vref). Because there is no latency, COT controllers result in lower voltage dip on the output supply rail when a load transient event happens. Some fixed frequency PWM controllers employ Non-Linear Control (NLC) to reduce droops on the output supply rail but non-linear controls (NLC) are employed when the output has already drooped sufficiently lest it may impact the normal operation and hence are not as effective as a COT controller.

PWM controllers usually have a slow loop, and despite the wide-usage of a parallel fast current loop to complement the slow loop, a PWM controller still has to wait until the start of the next switching cycle before it responds to load transients resulting in higher undershoot. The use of Non-Linear Control (NLC) is not very effective as they are employed once the output on the output supply rail is sufficiently below the set-point else it inhibits the normal operation. COT controllers being hysteretic controllers respond instantaneously to load changes. However, a conventional COT has two disadvantages: poor DC accuracy, and sub-optimal transient due to minimum off time.

Poor DC accuracy is a problem associated with a typical COT controller. This problem is the DC offset because of the nature of its feedback mechanism. As the COT controller maintains a value of the output at the target reference, there is an offset between the output DC voltage and the desired reference. This DC offset is a function of switching ripple which, in turn, changes with input voltage, output voltage, and inductor value and cannot be trimmed out in post-silicon processes.

In conventional COT, when a load transient event occurs, the controller uses a burst of 'ON' pulses separated by a minimum off time to replenish the lost charges on the output capacitor. This results in sub-optimal transient due to minimum off time. A minimum off time is used to avoid pulse swallowing of narrow pulses through the VR driver or to have sufficient time to reset the $T_{ON}$ generator capacitor. However, the off time prevents continuously charging the output capacitor during a load transient event and from obtaining an even better transient response.

Various embodiments described here improve upon the disadvantages associated with conventional COT architecture by improving DC accuracy and by providing one-shot inductor current. In some embodiments, the use of a high gain integrator eliminates the issue related to DC accuracy. As such, DC accuracy improves. The high gain path of various embodiments does not compromise the transient response. In various embodiments, eliminating the minimum off time helps to ramp up the inductor current in one-shot and charges the output capacitor fast enough for reduced undershoots.

In some embodiments, an apparatus (e.g., VR) is provided which includes: a bridge including a high-side switch and a low-side switch, wherein the high-side switch is coupled in series with the low-side switch. The apparatus includes a comparator to compare a voltage level on an output supply rail, coupled to the bridge, with a reference. In various embodiments, the apparatus includes a modulator to generate a signal to control the high-side switch and the low-side switch such that the high-side switch remains turned on beyond a turn-on time if the voltage level on the output supply rail remains below the reference. In some embodiments, the apparatus comprises a circuitry to generate the turn-on time. In some embodiments, the apparatus comprises a trans-conductance circuitry coupled to the output supply rail and the reference, wherein an output of the trans-conductance circuitry is coupled to the comparator. In some embodiments, the apparatus comprises a capacitor coupled to the output of the trans-conductance circuitry. In some embodiments, the trans-conductance circuitry comprises a trans-conductance amplifier. In some embodiments, the apparatus comprises a non-overlap circuitry coupled to the output of the modulator.

In some embodiments, the modulator receives an output of the comparator to determine, after the high-side switch is turned on and after the turn-on time expires, if an on-pulse, that determines the turn-on time, is substantially sufficient to charge the voltage level on the output supply rail above the reference. In some embodiments, the modulator determines that if a single on-pulse is substantially sufficient, the controller turns off the high-side switch. In some embodiments, the modulator determines that if the single on-pulse is substantially insufficient, the controller keeps the high-side switch turned on until a point when substantially sufficient charge is injected to an output capacitor, coupled to the output supply rail, for the voltage level to cross above the reference.

There are many technical effects of various embodiments. For example, the improved VR reduces the minimum operating voltage Vmin and/or frequency guard-band of SoCs (system-on-chips). Here, Vmin refers to the minimum operating voltage below which the logic receiving that voltage as supply does not function as expected. For example, a sequential logic operating on a supply below Vmin may lose the state stored in the sequential. That state is valid so long as the power supply voltage level to the sequential is at Vmin or above Vmin With the improved VR of various embodiments, SoC processor cores can be binned at a higher frequency for a given voltage set-point and this results in higher price margins for product manufactures. For applications like PCIe IO (peripheral component interconnect express IO) and DDR IO (double data rate IO) that run at fixed frequency, the voltage guard-banding can be reduced for energy savings using the improved VR of various embodiments. Switching VRs typically rely on an external inductor and capacitor. The architectural improvements of various embodiments enable use of smaller inductor and half the number of decoupling capacitors on board for the same VR performance, thus enabling smaller form factor devices and reduced board cost. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core.

Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies.

Here, the term "interconnect" refers to a communication link, or channel, between two or more points or nodes. It may comprise one or more separate conduction paths such as wires, vias, waveguides, passive components, and/or active components. It may also comprise a fabric.

Here the term "interface" generally refers to software and/or hardware used to communicate with an interconnect. An interface may include logic and I/O driver/receiver to send and receive data over the interconnect or one or more wires.

Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

FIG. 1 illustrates set of plots 100 showing VR DC inaccuracy and undershoot impact to core frequency. As discussed herein, DC inaccuracy and voltage droops are accounted for through frequency guard-banding of the processor cores resulting in sub-optimal power-performance and consequently, lower average selling price (ASP) of processor products. To illustrate further, consider the example of VRs used on a processor's Power Management IC (PMIC). As shown in plot 101, the VRs could have 50 mV drop from the voltage set point requiring 400 MHz core frequency guard-band. If the inaccuracy and/or undershoot can be reduced to half, the processor frequency can be set 200 MHz higher for the same voltage set point and the part can be binned higher as shown in plot 102. Some embodiments describe an improved VR that achieves the higher frequency bin as illustrated by plot 102.

Figure 2:
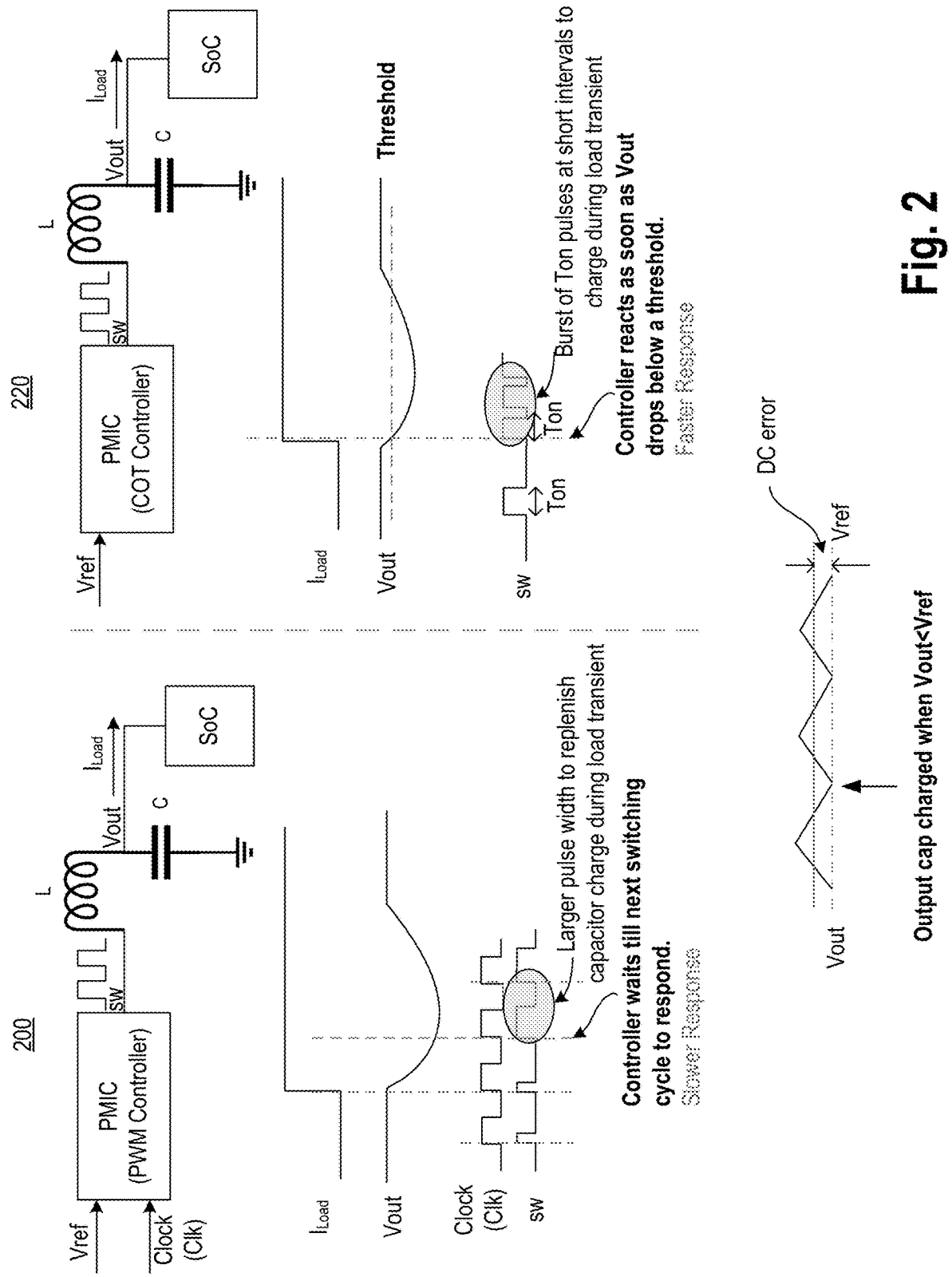
FIG. 2 illustrates a pulse width modulator (PWM) controller vs. power management integrated circuitry (PMIC) controller response.

FIG. 2 illustrates responses of pulse width modulator (PWM) controller vs. power management integrated circuitry (PMIC) controller. PWM controller and associated diagram is illustrated by identifier 200 while COT controller and associated timing diagram is illustrated by identifier 220. The output of the controller is a switching signal, sw, which is derived from a clock (Clk) as Vout (output voltage on capacitor C), varies relative to a voltage reference Vref. To improve load transients ($I_{Load}$), industry-leading PMICs use hysteretic COT controllers that react instantaneously. In a COT controller, the output capacitor C coupled to the inductor L is charged for a fixed ON time ($T_{ON}$) whenever the output Vout falls below the reference (Threshold). Because there is no latency, COT controllers result in lower voltage dip when a load transient event happens.

Figure 3:
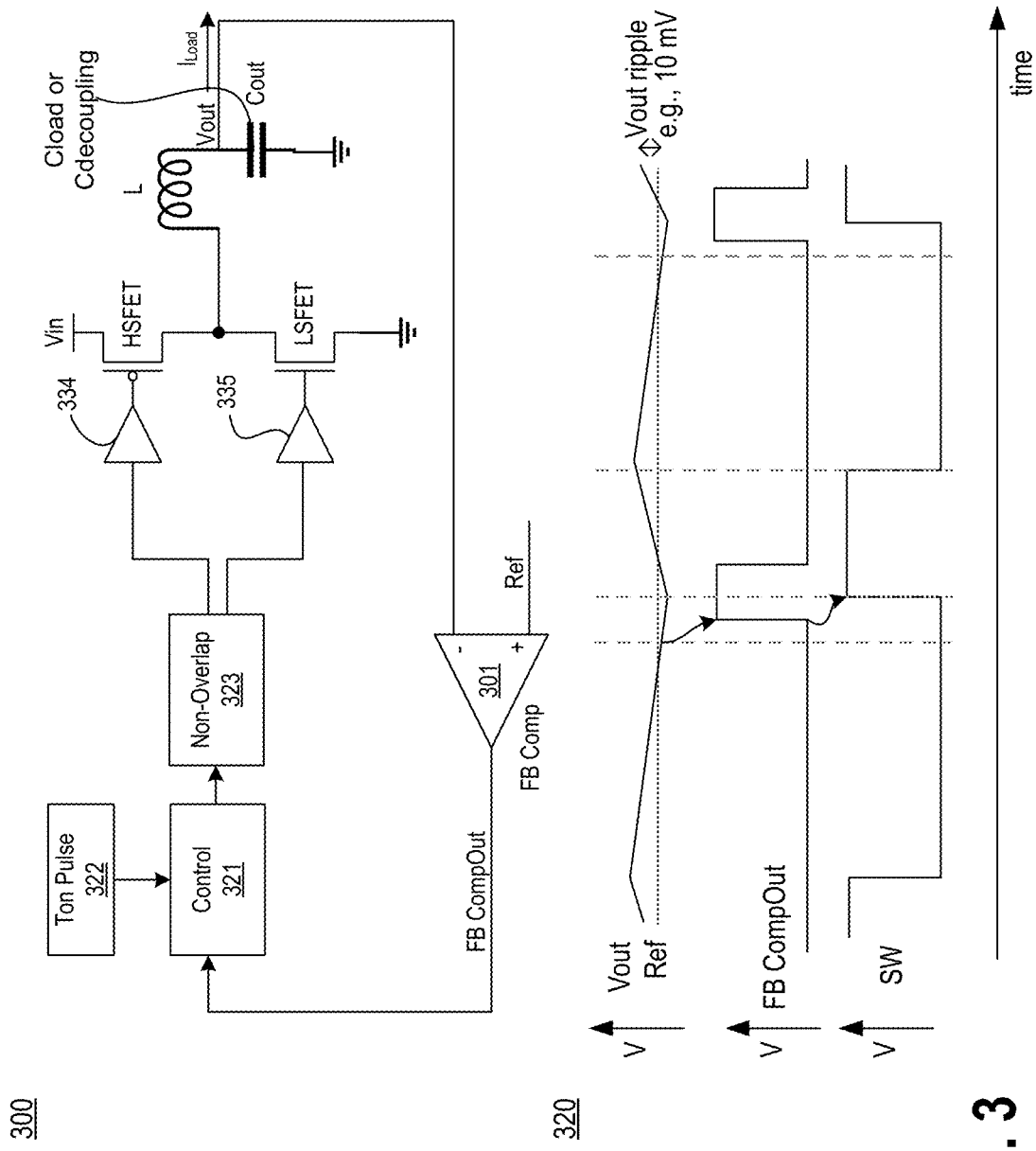
FIG. 3 illustrates a constant-on-time (COT) buck converter.

FIG. 3 illustrates a constant-on-time (COT) buck converter 300 and corresponding timing diagram 320. COT buck converter 300 comprises comparator (FB Comp) 301, control circuit 321, non-overlap circuitry 323, Ton pulse generator 322, driver 334, driver 335, high-side FET (HSFET), low-side FET (LSFET), inductor L, output capacitance Cout (also referred to as Cload or decoupling capacitor C) coupled as shown. Here, feedback comparator (FB Comp) 301 turns on the HSFET for a fixed amount of time ($T_{ON}$) generated by Ton Pulse generator 322 to charge the output capacitor Cout whenever the output voltage Vout drops below the reference (Ref) as indicated by the output FB CompOut of feedback comparator 301. The control circuitry 321 generates the switching signal sw as an output which is provided to non-overlap circuitry 323.

In some embodiments, non-overlap circuitry 323 is coupled to the output of the modulator or control circuitry 321. In some embodiments, non-overlap circuitry 323 ensures that both the HSFET switch and LSFET switch do not turn on at the same time resulting in large shoot-through currents from supply to ground.

For stability across different operating conditions, COT controllers use emulated ripple generator that emulates the ESR (electron spin resonance) behavior of the output capacitor Cout. For a fixed-ON Time architecture, the control loop regulates the switching frequency to get the desired output. Most COT architectures use an adaptive ON Time so that the switching frequency remains pseudo-constant. These enhancements are inherited in the COT controller used in various embodiments.

Figure 4:
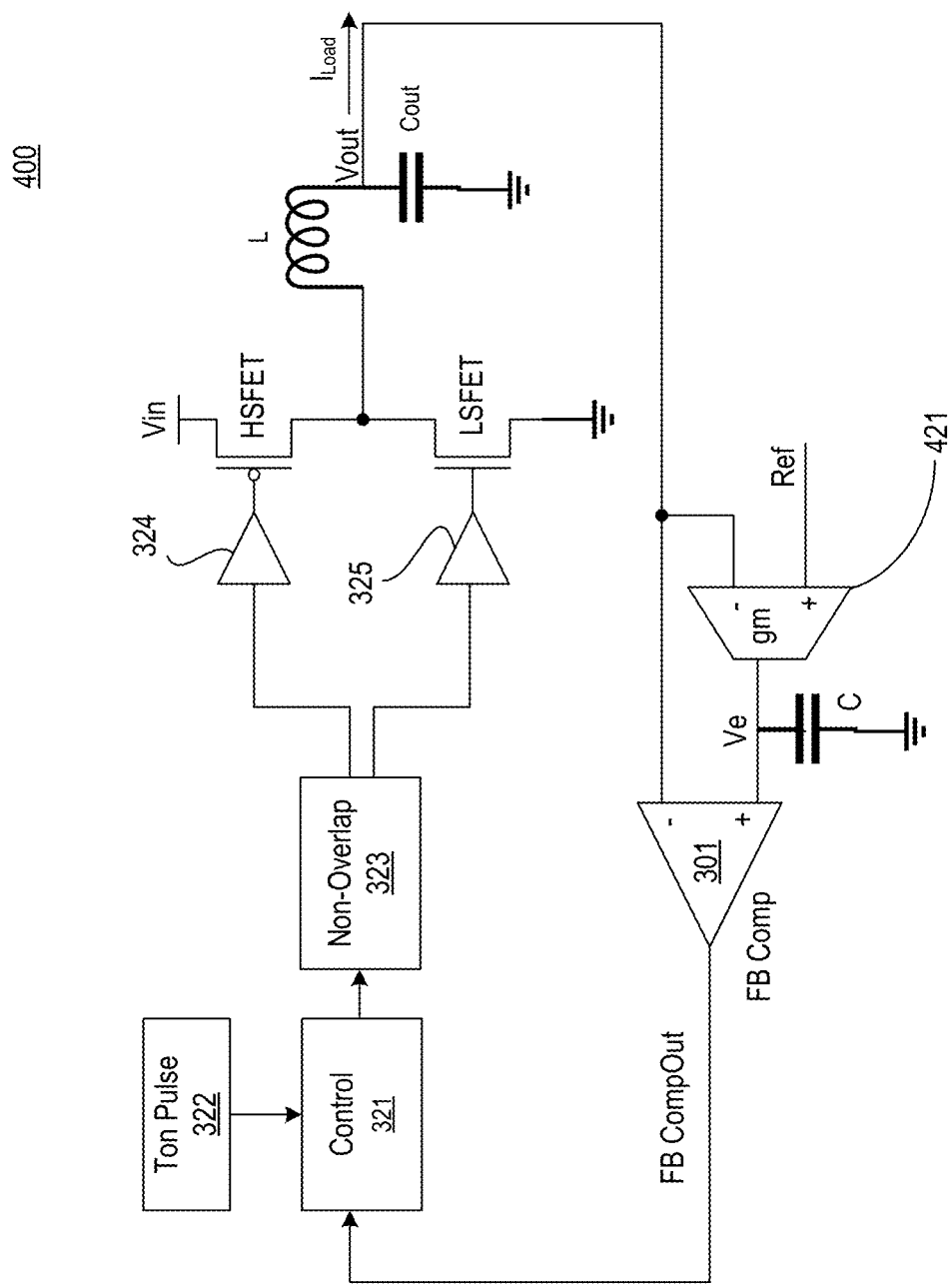
FIG. 4 illustrates a converter with high gain slow loop to eliminate or reduce DC offset, in accordance with some embodiments.

FIG. 4 illustrates converter 400 with high gain slow loop to eliminate or reduce DC offset, in accordance with some embodiments. Compared to FIG. 3, here converter 400 includes a trans-conductance stage (gm stage) 421 coupled to comparator 301. Trans-conductance circuitry (gm-amplifier) 421 is coupled to the output supply rail and the reference, wherein an output Ve of the trans-conductance circuitry is coupled to comparator 301. In some embodiments, a capacitor C is coupled to the output of the trans-conductance circuitry 421. In various embodiments, trans-conductance circuitry 421 comprises a trans-conductance amplifier. Any suitable trans-conductance amplifier may be used.

Figure 5:
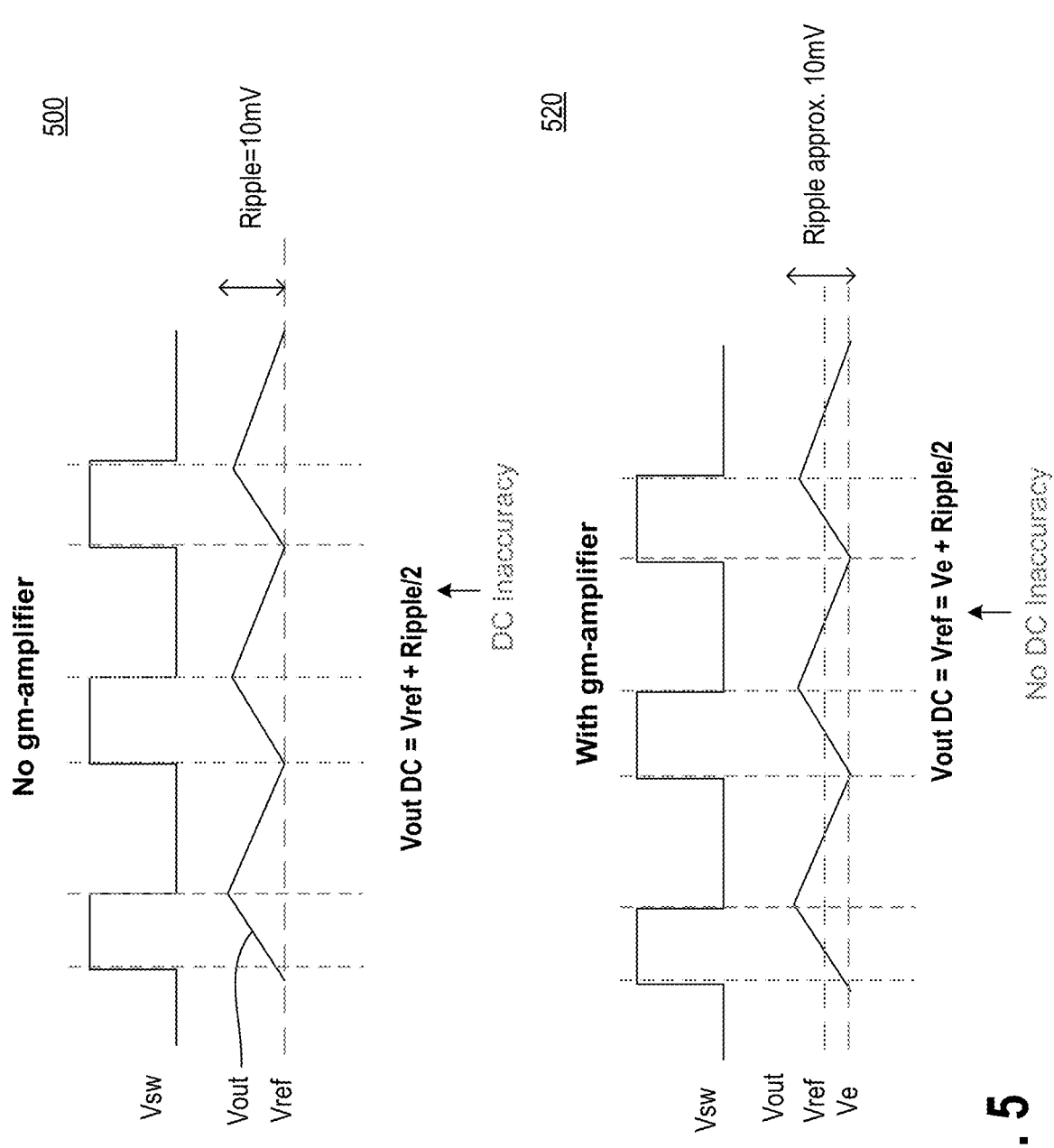
FIG. 5 illustrates a set of plots associated with the converter of FIG. 4, in accordance with some embodiments.

FIG. 5 illustrates a set of plots 500 and 520 associated with converter 400 of FIG. 4, in accordance with some embodiments. Plot 500 shows the operation of conventional COT controller of FIG. 3. Conventional COT has inherent DC inaccuracy as it tries to maintain the value of the output at the target reference. As this DC offset is a function of switching ripple, it varies with input voltage, output voltage, and inductor value and cannot be trimmed out with a fixed offset in post-silicon.

Plot 520 shows the operation of the COT controller of FIG. 4, in accordance with some embodiments. If the reference Vref to feedback comparator 301 were to be artificially shifted down, depending on the ripple, the DC offset can be eliminated. As shown in FIG. 5, a high gain slow loop that integrates the error between the output voltage Vout and target reference Vref is used to generate an error voltage Ve for feedback comparator 301, in accordance with some embodiments. At steady state when the integrator ensures that there is no offset between the output DC and reference, the error voltage Ve is, in fact below the actual reference by an amount equal to the ripple amplitude. This high gain slow loop does not impact the transient performance as the fast loop through feedback comparator remains intact.

Figure 6:
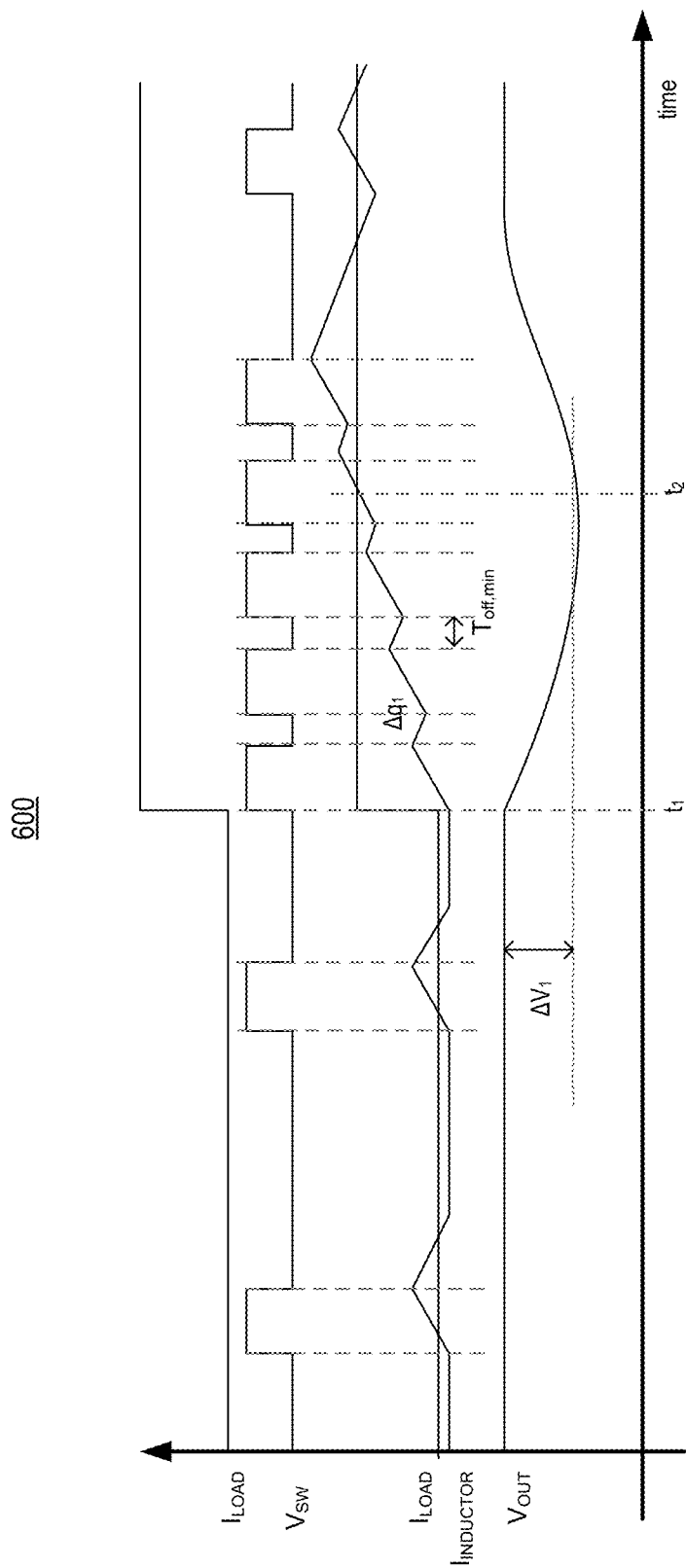
FIG. 6 illustrates a timing diagram of a COT converter with minimum off-time.

FIG. 6 illustrates timing diagram 600 of a COT converter with minimum off-time. In conventional COT, the burst of 'ON' pulses during load transients are separated by a minimum Off Time ($T_{OFF}$, min) intended to avoid pulse swallowing of narrow pulses through the driver or to have sufficient time to reset the TON generator capacitor, as shown in FIG. 6.

Figure 7:
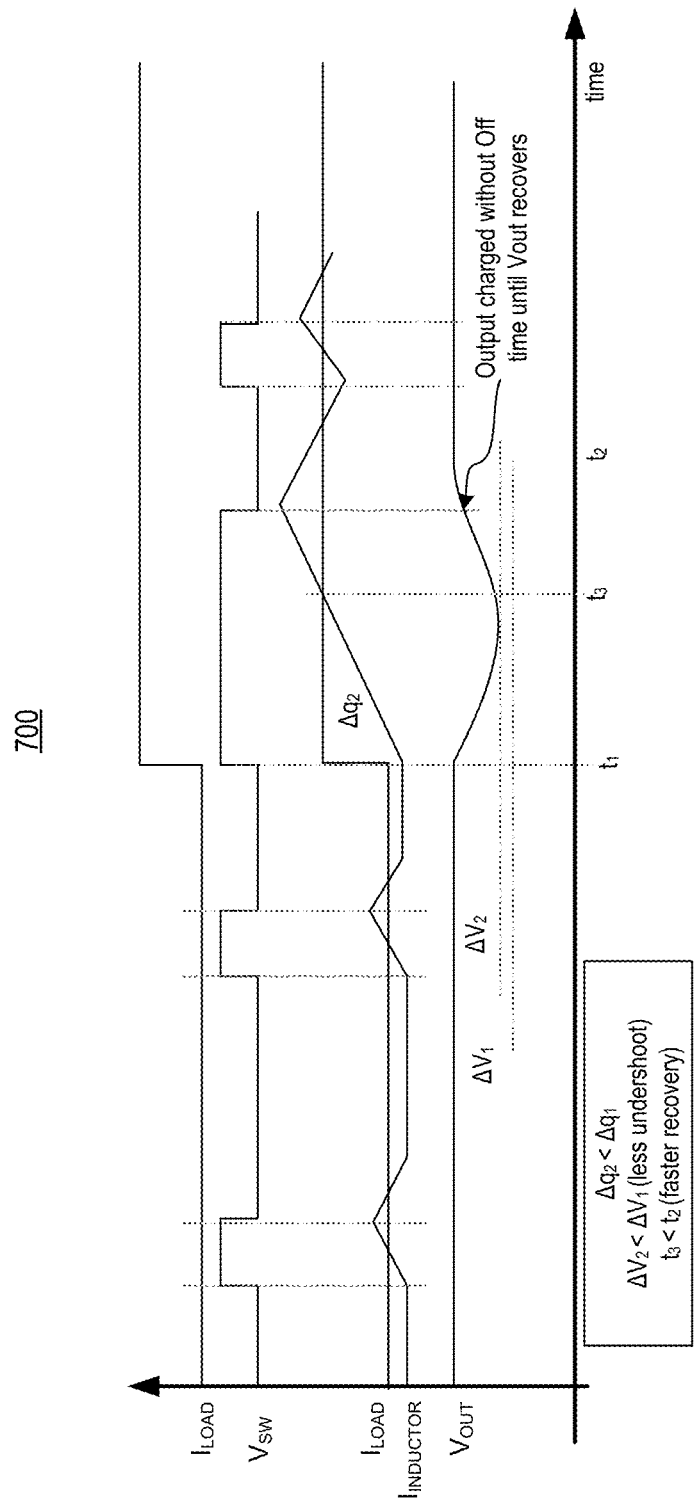
FIG. 7 illustrates a timing diagram of an improved COT converter with no minimum off-time for faster transient response, in accordance with some embodiments.

FIG. 7 illustrates timing diagram 700 of an improved COT converter with no minimum off-time for faster transient response, in accordance with some embodiments. Various embodiments introduce the novelty of keeping the HSFET continuously ON even beyond the $T_{ON}$ pulse width until the output voltage comes back above the reference. As shown in FIG. 7, the elimination of off time helps to replenish the lost output charges faster and reduces the output dip.

Figure 8:
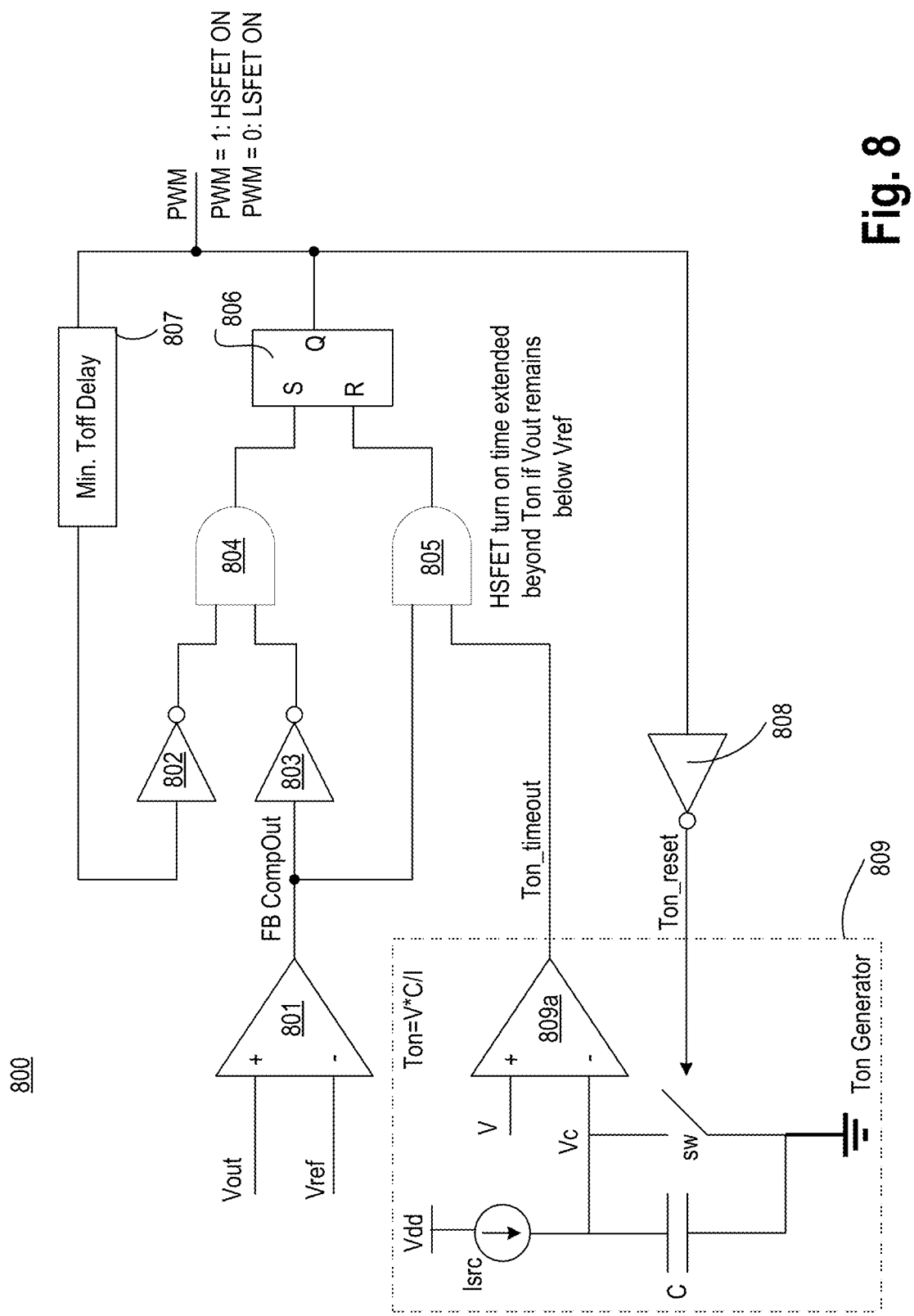
FIG. 8 illustrates a circuit schematic of a one-shot inductor current scheme, according to some embodiments.

FIG. 8 illustrates a circuit schematic of a one-shot inductor current circuitry 800, in according to some embodiments. Fixed Frequency converters usually support a Pulse Skipping Mode (PSM) or Pulse-Frequency Mode (PFM) at low loads or DCM (duty cycle modulation) for reducing switching losses and for improving light-load efficiency. However, during a load transient event, the controller switches to a PWM control mode as the pulse frequency modulation (PFM) and/or pulse skip modulation PSM loop cannot sustain high continuous current mode (CCM) currents. The switching between PSM/PFM and PWM mode is done based on current telemetry. The Constant-on-Time (COT) controller has the advantage that it has a seamless auto-transition from DCM at light-loads to CCM at heavy-loads and vice-versa without the need to switch modes.

In some embodiments, the VR comprises a bridge including HSFET and LSFET coupled in series with the HSFET. In some embodiments, the VR comprises circuitry 800 which includes comparator 801 (same as 301), inverter 802, inverter 803, AND gate 804, SR-latch 806, delay buffer 807, inverter 808, and Ton Generator 809 coupled as shown. In some embodiments, Ton Generator 809 comprises comparator 809a, current source Isrc, capacitor C, and switch sw coupled as shown.

In some embodiments, comparator 801 (e.g., FB_Comp) compares a voltage level (Vout) on an output supply rail, coupled to the bridge, with a reference (Vref). The output of FB_Comp 801 is FB ComOout. In some embodiments, the VR comprises a modulator (or controller) to generate a signal (PWM) to control the HSFET and LSFETs such that the HSFET remains turned on beyond a turn-on time ($T_{ON}$) if the voltage level on the output supply rail remains below the reference. The modulator includes inverter 802, inverter 803, AND gate 804, AND gate 805, SR-latch 806, delay buffer 807, inverter 808, and Ton Generator 809.

In some embodiments, Ton Generator 809 generates turn-on time (Ton time). Ton time generator circuit 809 comprises a current source that pumps current into capacitor C. The voltage across the capacitor C is reset to ground through switch sw when the HSFET is off. When the HSFET turns on, the voltage across the capacitor C rises linearly from ground because of the constant current 'I' from Isrc being pumped into it. When the capacitor voltage reaches a voltage V, comparator 809a flips indicating the completion of the on-time duration. The voltage V against which the capacitor voltage Vc is compared can be the same as the reference voltage Vref, in some embodiments.

In some embodiments, as shown in FIG. 4, the VR comprises a trans-conductance circuitry (gm-amplifier) coupled to the output supply rail and the reference, wherein an output of the trans-conductance circuitry is coupled to comparator 801. In some embodiments, a capacitor is coupled to the output of the trans-conductance circuitry. In various embodiments, the trans-conductance circuitry comprises a trans-conductance amplifier. Any suitable trans-conductance amplifier may be used.

In some embodiments, as shown in FIG. 4, the VR comprises non-overlap circuitry 323 coupled to the output of the modulator (e.g., output of SR-latch 805). In some embodiments, non-overlap circuitry 323 ensures that both the HSFET switch and LSFET switch do not turn on at the same time resulting in large shoot-through currents from supply to ground.

After the HSFET is turned on, when the TON time expires (e.g., Ton_timeout=1), the controller (e.g., circuitry 800) uses the output (FB CompOut) of feedback comparator 801 to check if the On pulse was sufficient to charge the output Vout above the reference Vref. If a single On pulse was sufficient, the controller turns off the HSFET; otherwise the controller keeps the HSFET On until the point when sufficient charge is injected into the output capacitor for the feedback Vout to cross above the reference Vref. In some embodiments, a minimum Toff delay 807 is used to avoid narrow pulses when the HSFET is turned off. In various embodiments, the output PWM of FIG. 8 is used to drive the HSFET and the LSFET of the VR bridge.

In some embodiments, the controller receives an output (FB Compout) of comparator 801 to determine, after the high-side switch is turned on and after the turn-on time expires, if an on-pulse of the signal is substantially sufficient to charge the voltage level Vout on the output supply rail above the reference Vref. In some embodiments, the controller determines that if a single on-pulse is substantially sufficient, the controller turns off the high-side switch. In some embodiments, the controller determines that if the single on-pulse is substantially insufficient, the controller keeps the high-side switch turned on until a point when substantially sufficient charge is injected to an output capacitor, coupled to the output supply rail, for the voltage level to cross above the threshold Vref.

In some embodiments, circuitry 800 comprises minimum off-time delay block 807 coupled to the modulator output PWM to ensure that the generated PWM signal stays low for a minimum pulse width. Here, node names and signal names are used interchangeably. For example, PWM may refer to node PWM or signal PWM depending on the context of the sentence. The minimum pulse width is used to avoid narrow pulses and ensure that the pulse can pass to the LSFET without any pulse swallowing. It is also used to ensure that the off time is sufficient to reset the voltage across the capacitor of TON generator 809 to ground.

Figure 9:
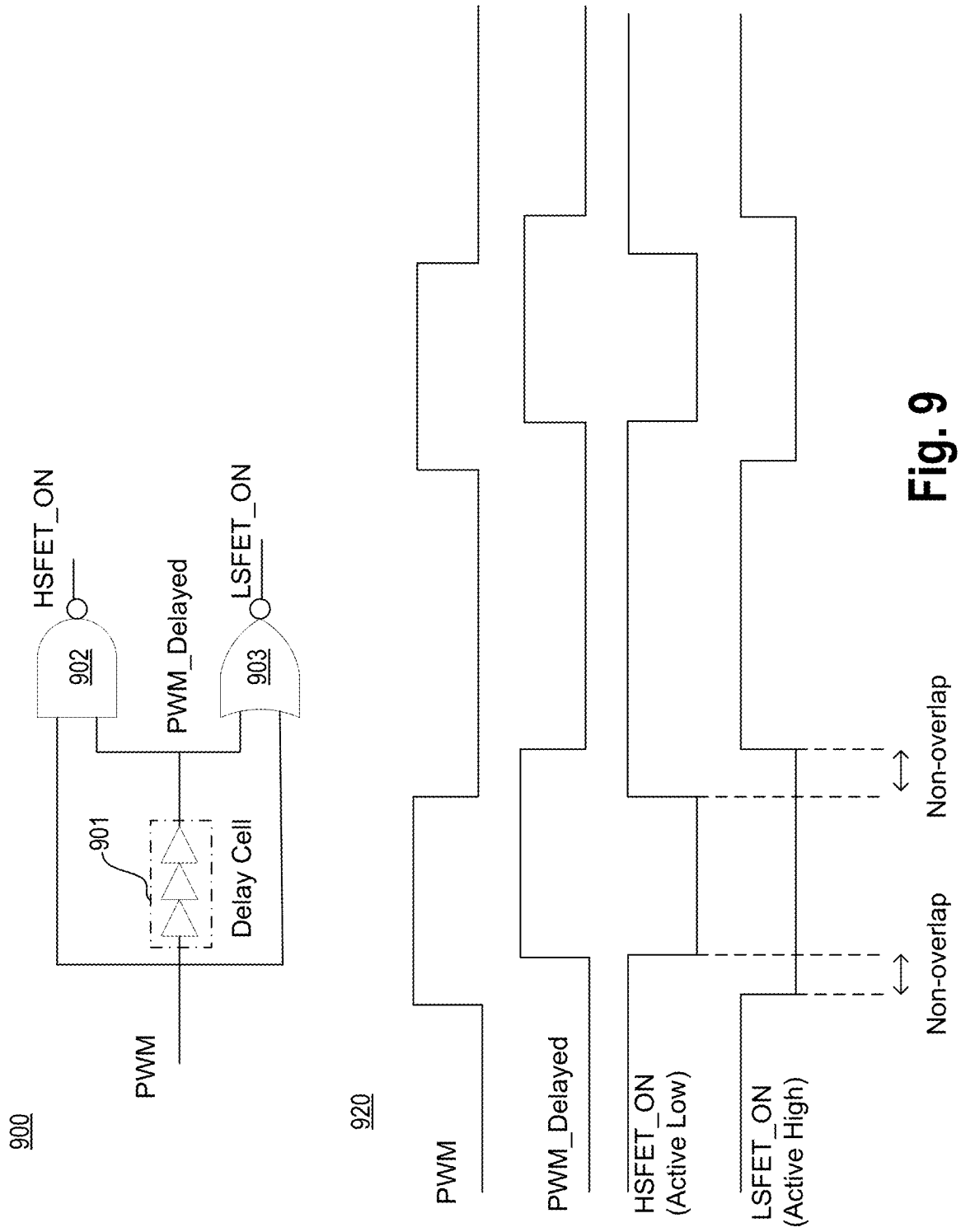
FIG. 9 illustrates a non-overlap circuit according to some embodiments

FIG. 9 illustrates non-overlap circuit 900 (e.g., 323) and corresponding timing diagram 920, according to some embodiments. In some embodiments, non-overlap circuitry 900 comprises delay block 901, NAND gate 902, and NOR gate 903. In some embodiment, delay block 901 receives the PWM output from circuitry 800 and determines the non-overlap delay used to generate the non-overlap outputs HSFET_ON and LSFET_ON to control the high-side and low-side switches respectively.

Figure 10:
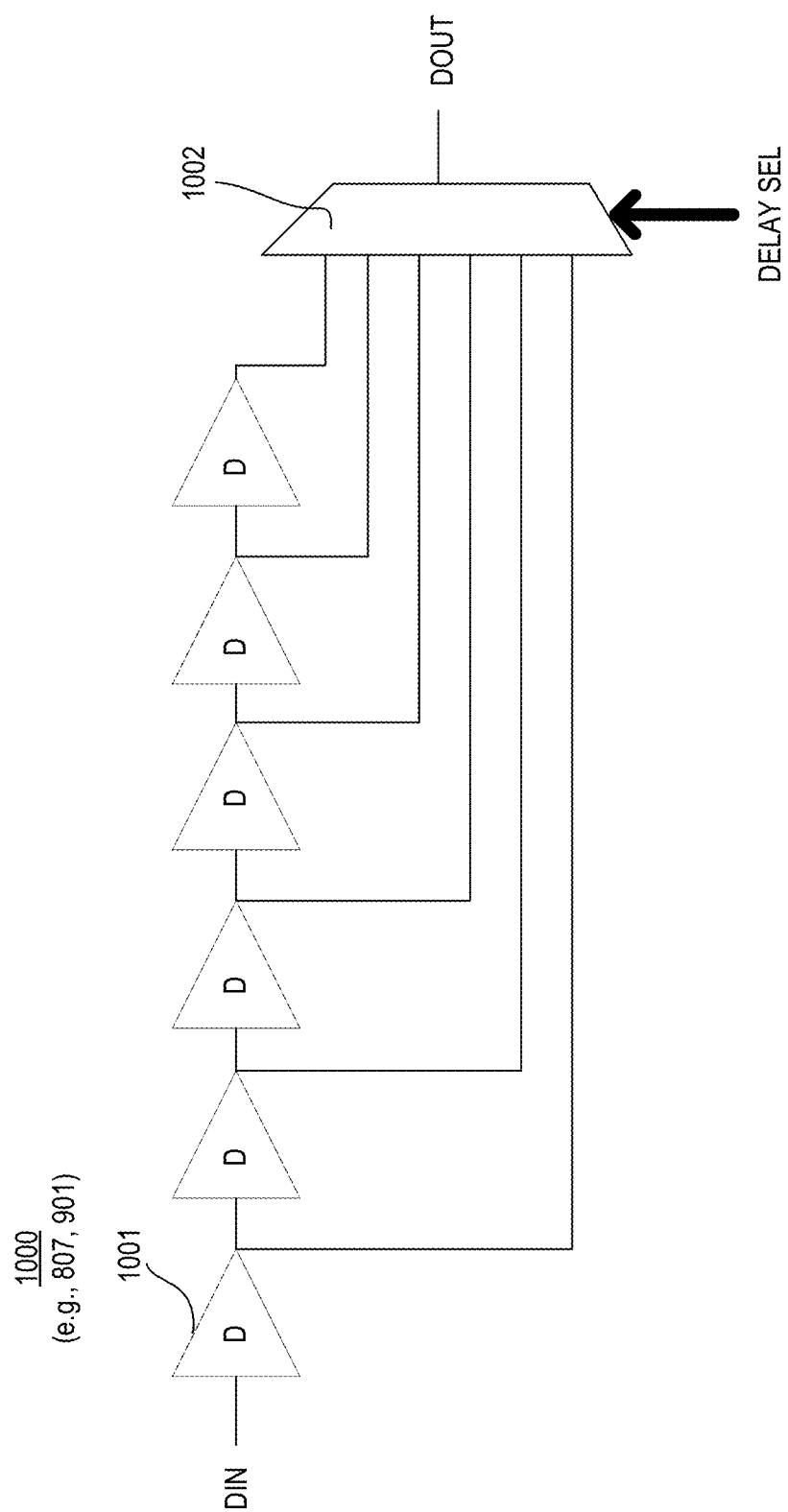
FIG. 10 illustrates a circuit implementation of minimum off time delay generator, in accordance with some embodiments

FIG. 10 illustrates circuit implementation of minimum off time delay generator 1000 (e.g., 807), in accordance with some embodiments. Time delay generator 1000 comprises a plurality of delay elements 1001 (e.g., buffers or logic configured as buffers), and multiplexer 1002 coupled as shown. The first delay element 1001 receives DIN and generates a number of delayed signals as the signal DIN propagates through the delay elements. A select signal DELAY SEL is used to provide DOUT from one of the outputs of the delay stages. Multiplexer 1002 with a programmable select line DELAY SEL is used to select the appropriate delayed signal. In some embodiments, delay 901 of FIG. 9 can also be implemented using circuit 1000.

Figure 11:
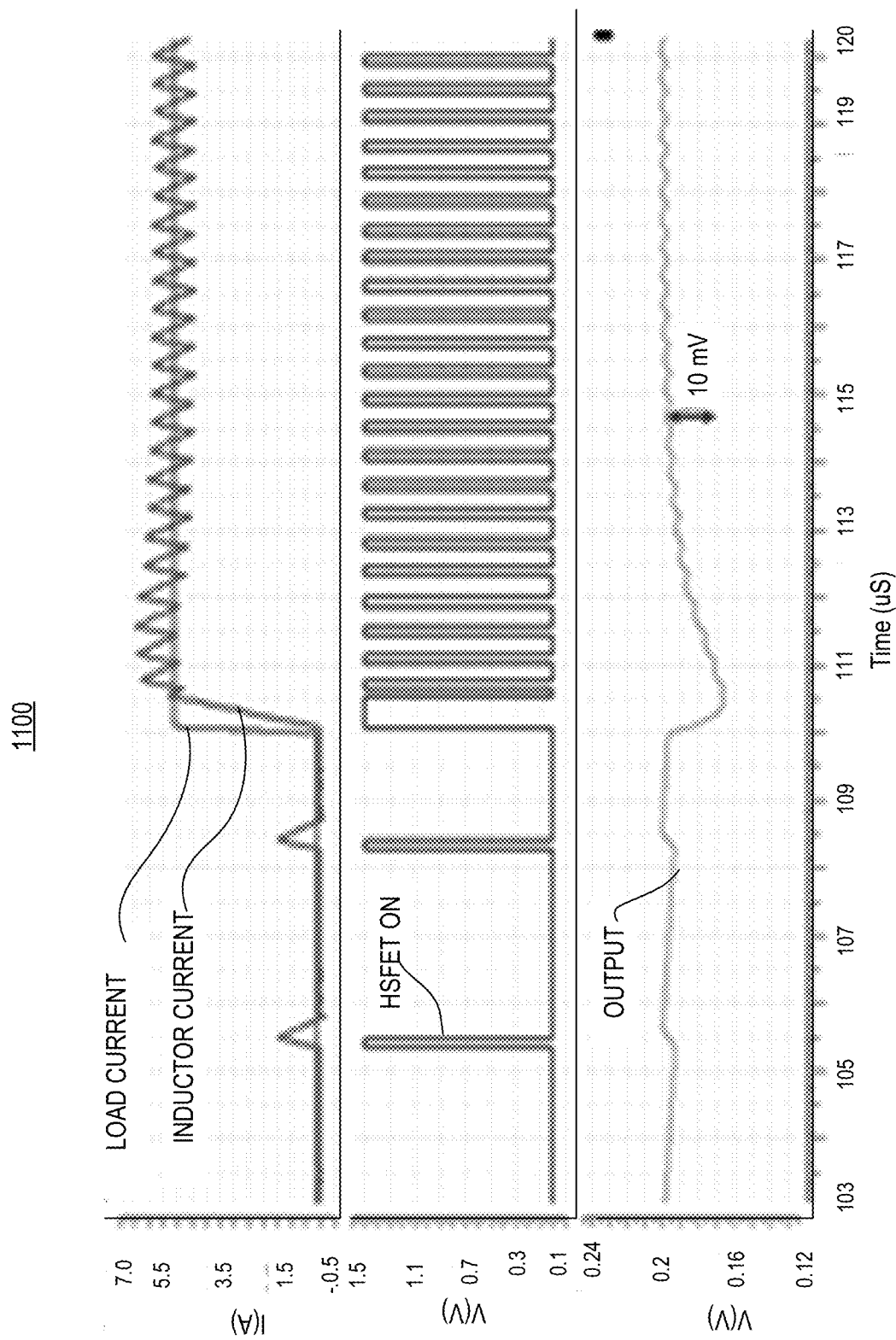
FIG. 11 illustrates a plot showing load transient response with the one-shot inductor current feature, in accordance with some embodiments.

FIG. 11 illustrates plot 1100 showing load transient response with one-shot inductor current feature, in accordance with some embodiments. With a load-step of 0 to 5 A in 100 ns, the controller of various embodiments is seen to have an undershoot of 30 mV, for example. As shown in FIG. 11, the inductor current ramps up fast at one shot resulting in 2× lower undershoot compared to a PWM controller with non-linear controls.

The comparison with the previous generation PMICs is shown in Table 1. All key performance indices (KPIs) show great improvements compared to previous generation PMICs.

TABLE 1

| Parameter | Previous generation PMIC | Embodiment of invention |
|---|---|---|
| DC Accuracy at 1 V output | ±10 mV | ±5 mV |
| Transient droop (0 to 4 A load step in 100 ns) | 40 mV | 20 mV |
| Output Capacitors for same transient performance | 2 *47 uF | 1*47 uF |
| Board Area | 450 mm$^2$ | 400 mm$^2$ |

Figure 12:
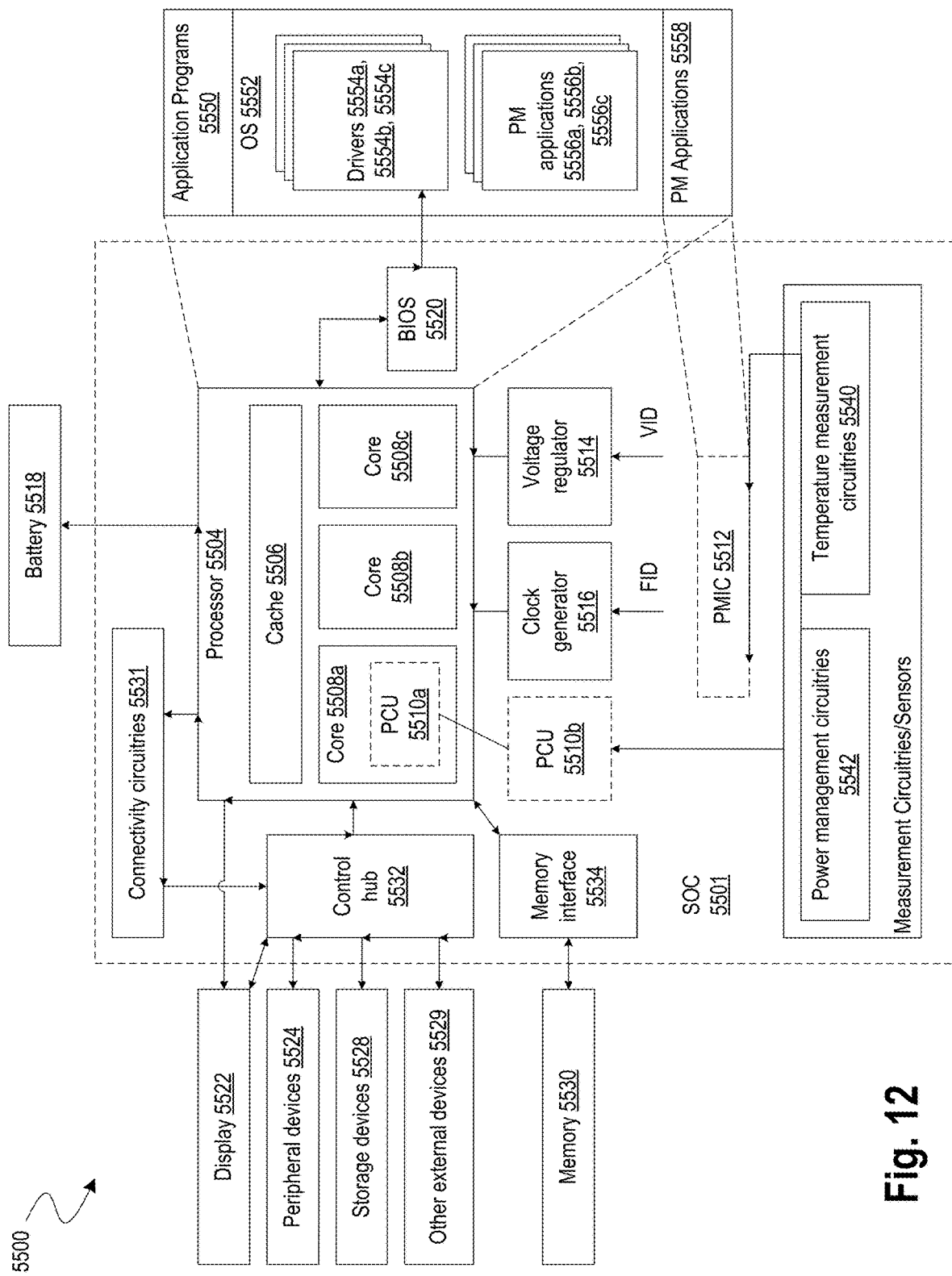
FIG. 12 illustrates a smart device or a computer system or an SoC (System-on-Chip) with apparatus for enhanced COT buck intellectual property (IP) for processor power performance improvement and smaller form factor enablement, in accordance with some embodiments.

FIG. 12 illustrates a smart device or a computer system or a SoC (System-on-Chip) with apparatus for enhanced constant-on-time buck intellectual property for processor power performance improvement and smaller form factor enablement, in accordance with some embodiments. It is pointed out that those elements of FIG. 12 having the same reference numbers (or names) as the elements of any other figure may operate or function in any manner similar to that described, but are not limited to such.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 12, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing means. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 12, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508*a*, 5508*b*, 5508*c*, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VIO) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510*a/b* and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, VR 5514 includes a one-shot inductor current scheme which comprises a controller to generate a signal to control a high-side switch and a low-side switch such that the high-side switch remains turned on beyond a turn-on time if a voltage level on an output supply rail remains below a reference. The scheme reduces the minimum operating voltage Vmin and/or frequency guardband of SoC 5501.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, battery 5518 periodically checks an actual battery capacity or energy with charge to a preset voltage (e.g., 4.1 V). The battery then decides of the battery capacity or energy. If the capacity or energy is insufficient, then an apparatus in or associated with the battery slightly increases charging voltage to a point where the capacity is sufficient (e.g. from 4.1 V to 4.11 V). The process of periodically checking and slightly increase charging voltage is performed until charging voltage reaches specification limit (e.g., 4.2 V). The scheme described herein has benefits such as battery longevity can be extended, risk of insufficient energy reserve can be reduced, burst power can be used as long as possible, and/or even higher burst power can be used.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510a. In an example, some other sections of PCU 5510 may be implemented outside the processing cores 5508, and these sections of PCU 5510 are symbolically illustrated using a dotted box and labelled as PCU 5510b. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package.

In various embodiments, each die (or dielet) includes a power management unit (PMU) or p-unit. For example, processor dies can have a supervisor p-unit, supervisee p-unit, or a dual role supervisor/supervisee p-unit. In some embodiments, an I/O die has its own dual role p-unit such as supervisor and/or supervisee p-unit. The p-units in each die can be instances of a generic p-unit. In one such example, all p-units have the same capability and circuits, but are configured (dynamically or statically) to take a role of a supervisor, supervisee, and/or both. In some embodiments, the p-units for compute dies are instances of a compute p-unit while p-units for IO dies are instances of an IO p-unit different from the compute p-unit. Depending on the role, p-unit acquires specific responsibilities to manage power of the multichip module and/or computing platform. While various p-units are described for dies in a multichip module or system-on-chip, a p-unit can also be part of an external device such as I/O device.

Here, the various p-units do not have to be the same. The HPM architecture can operate very different types of p-units. One common feature for the p-units is that they are expected to receive HPM messages and are expected to be able to comprehend them. In some embodiments, the p-unit of IO dies may be different than the p-unit of the compute dies. For example, the number of register instances of each class of register in the IO p-unit is different than those in the p-units of the compute dies. An IO die has the capability of being an HPM supervisor for CXL connected devices, but compute die may not need to have that capability. The IO and computes dice also have different firmware flows and possibly different firmware images. These are choices that an implementation can make. An HPM architecture can choose to have one superset firmware image and selectively execute flows that are relevant to the die type the firmware is associated with. Alternatively, there can be a customer firmware for each p-unit type; it can allow for more streamlined sizing of the firmware storage requirements for each p-unit type.

The p-unit in each die can be configured as a supervisor p-unit, supervisee p-unit or with a dual role of supervisor/supervisee 105. As such, p-units can perform roles of supervisor or supervisee for various domains. In various embodiments, each instance of p-unit is capable of autonomously managing local dedicated resources and contains structures to aggregate data and communicate between instances to enable shared resource management by the instance configured as the shared resource supervisor. A message and wire-based infrastructure is provided that can be duplicated and configured to facilitate management and flows between multiple p-units.

In some embodiments, power and thermal thresholds are communicated by a supervisor p-unit to supervisee p-units. For example, a supervisor p-unit learns of the workload (present and future) of each die, power measurements of each die, and other parameters (e.g., platform level power boundaries) and determines new power limits for each die. These power limits are then communicated by supervisor p-units to the supervisee p-units via one or more interconnects and fabrics. In some embodiments, a fabric indicates a group of fabrics and interconnect including a first fabric, a second fabric, and a fast response interconnect. In some embodiments, the first fabric is used for common communication between a supervisor p-unit and a supervisee p-unit. These common communications include change in voltage, frequency, and/or power state of a die which is planned based on a number of factors (e.g., future workload, user behavior, etc.). In some embodiments, the second fabric is used for higher priority communication between supervisor p-unit and supervisee p-unit. Example of higher priority communication include a message to throttle because of a possible thermal runaway condition, reliability issue, etc. In some embodiments, a fast response interconnect is used for communicating fast or hard throttle of all dies. In this case, a supervisor p-unit may send a fast throttle message to all other p-units, for example. In some embodiments, a fast response interconnect is a legacy interconnect whose function can be performed by the second fabric.

The HPM architecture of various embodiments enables scalability, modularity, and late binding of symmetric and/or asymmetric dies. Here, symmetric dies are dies of same size, type, and/or function, while asymmetric dies are dies of different size, type, and/or function. Hierarchical approach also allows PMU functions that may already exist on other dice to be leveraged, instead of being disabled in the traditional flat power management scheme. HPM does not assume a pre-determined mapping of physical partitions to domains. An HPM domain can be aligned with a function integrated inside a dielet, to a dielet boundary, to one or more dielets, to a companion die, or even a discrete CXL device. HPM enables management of any arbitrary collection of functions independent of their level of integration. In some embodiments, a p-unit is declared a supervisor p-unit based on one or more factors. These factors include memory size, physical constraints (e.g., number of pin-outs), and locations of sensors (e.g., temperature, power consumption, etc.) to determine physical limits of the processor.

The HPM architecture of various embodiments, provides a means to scale power management so that a single p-unit instance does not need to be aware of the entire processor. This enables power management at a smaller granularity and improves response times and effectiveness. Hierarchical structure maintains a monolithic view to the user. For example, at an operating system (OS) level, HPM architecture gives the OS a single PMU view even though the PMU is physically distributed in one or more supervisor-supervisee configurations.

In some embodiments, the HPM architecture is centralized where one supervisor controls all supervisees. In some embodiments, the HPM architecture is decentralized, wherein various p-units in various dies control overall power management by peer-to-peer communication. In some embodiments, the HPM architecture is distributed where there are different supervisors for different domains. One example of a distributed architecture is a tree-like architecture.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556a, 5556b, 5556c. The OS 5552 may also include various drivers 5554a, 5554b, 5554c, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 5510a/b has a capability to enable extra compute and telemetries resources for the runtime support of the pCode. Here pCode refers to a firmware executed by PCU 5510a/b to manage performance of the 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SCO 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the $P_{soc,pk}$ SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level ($P_{soc,th}$) based on the available battery power (which changes slowly) and set the SoC throttling peak power ($P_{soc,th}$). In some embodiments, pCode decides the frequencies and voltages based on $P_{soc,th}$. In this case, throttling events have less negative effect on the SoC performance Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a bridge including a high-side switch and a low-side switch, wherein the high-side switch is coupled in series with the low-side switch; a comparator to compare a voltage level on an output supply rail, coupled to the bridge, with a reference; and a modulator to generate a signal to control the high-side switch and the low-side switch such that the high-side switch remains turned on beyond a turn-on time if the voltage level on the output supply rail remains below the reference.

Example 2: The apparatus of claim 1 comprises a circuitry to generate the turn-on time.

Example 3: The apparatus of example 1 comprises a trans-conductance circuitry coupled to the output supply rail and the reference, wherein an output of the trans-conductance circuitry is coupled to the comparator.

Example 4: The apparatus of example 3 comprises a capacitor coupled to the output of the trans-conductance circuitry.

Example 5: The apparatus of example 3, wherein the trans-conductance circuitry comprises a trans-conductance amplifier.

Example 6: The apparatus of example 1 comprises a non-overlap circuitry coupled to the output of the modulator.

Example 7: The apparatus of example 1, wherein the modulator receives an output of the comparator to determine, after the high-side switch is turned on and after the turn-on time expires, if an on-pulse, that determines the turn-on time, is substantially sufficient to charge the voltage level on the output supply rail above the reference.

Example 8: The apparatus of example 7, wherein the modulator determines that if a single on-pulse is substantially sufficient, the controller turns off the high-side switch.

Example 9: The apparatus of example 8, wherein the modulator determines that if the single on-pulse is substantially insufficient, the controller keeps the high-side switch turned on until a point when substantially sufficient charge is injected to an output capacitor, coupled to the output supply rail, for the voltage level to cross above the reference.

Example 10: An apparatus comprising: a bridge including a high-side switch and a low-side switch coupled in series with the high-side switch; an inductor coupled to the bridge; a capacitor coupled to the inductor and an output supply rail; and a controller to generate a signal to control the high-side switch and the low-side switch such that the high-side switch remains turned on beyond a turn-on time if a voltage level on the output supply rail remains below a reference.

Example 11: The apparatus of example 10 comprises a comparator to compare the voltage level on the output supply rail with the reference.

Example 12: The apparatus of example 11, wherein the controller receives an output of the comparator to determine, after the high-side switch is turned on and after the turn-on time expires, if an on-pulse, that determines the turn-on time, is substantially sufficient to charge the voltage level on the output supply rail above the reference.

Example 13: The apparatus of example 12, wherein the controller determines that if a single on-pulse is substantially sufficient, the controller turns off the high-side switch.

Example 14: The apparatus of example 13, wherein the controller determines that if the single on-pulse is substantially insufficient, the controller keeps the high-side switch turned on until a point when substantially sufficient charge is injected to an output capacitor, coupled to the output supply rail, for the voltage level to cross above the reference.

Example 15: A system comprising: a memory; a processor core coupled to the memory; and a voltage regulator to power the processor core, wherein the voltage regulator comprises: a bridge including a high-side switch and a low-side switch coupled in series with the high-side switch; a comparator to compare a voltage level on an output supply rail, coupled to the bridge, with a reference; a modulator to generate a signal to control the high-side and low-side switches such that the high-side switch remains turned on beyond a turn-on time if the voltage level on the output supply rail remains below the reference; and a circuitry to generate the turn-on time.

Example 16: The system of example 15, wherein the voltage regulator comprises: a trans-conductance circuitry coupled to the output supply rail and the reference, wherein an output of the trans-conductance circuitry is coupled to the comparator; and a capacitor coupled to the output of the trans-conductance circuitry, wherein the trans-conductance circuitry comprises a trans-conductance amplifier.

Example 17: The system of example 15, wherein the voltage regulator comprises a non-overlap circuitry coupled to the output of the modulator.

Example 18: The system of example 15, wherein the modulator receives an output of the comparator to determine, after the high-side switch is turned on and after the turn-on time expires, if an on-pulse, that determines the turn-on time, is substantially sufficient to charge the voltage level on the output supply rail above the reference.

Example 19: The system of example 18, wherein the modulator determines that if a single on-pulse is substantially sufficient, the controller turns off the high-side switch.

Example 20: The system of example 19, wherein the modulator determines that if the single on-pulse is substantially insufficient, the controller keeps the high-side switch turned on until a point when substantially sufficient charge is injected to an output capacitor, coupled to the output supply rail, for the voltage level to cross above the reference.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
   a bridge including a high-side switch and a low-side switch, wherein the high-side switch is coupled in series with the low-side switch;
   a comparator to compare a voltage level on an output supply rail, coupled to the bridge, with a reference; and
   a modulator to receive an output of the comparator, wherein:
      in response to the output of the comparator, the modulator is to generate a signal to control the high-side switch and the low-side switch,
      the signal is to turn on the high-side switch for a turn-on time when the voltage level on the output supply rail falls below the reference, and
      at an expiration of the turn-on time, if the voltage level on the output supply rail remains below the reference, the signal is to continue to turn on the high-side switch until the voltage level on the output supply rail is above the reference.

2. The apparatus of claim 1, further comprising circuitry to generate the turn-on time.

3. The apparatus of claim 1, further comprising a trans-conductance circuitry coupled to the output supply rail and the reference, wherein an output of the trans-conductance circuitry is coupled to the comparator.

4. The apparatus of claim 3, further comprising a capacitor coupled to the output of the trans-conductance circuitry.

5. The apparatus of claim 3, wherein the trans-conductance circuitry comprises a trans-conductance amplifier.

6. The apparatus of claim 1, further comprising a non-overlap circuitry coupled to an output of the modulator.

7. The apparatus of claim 1, wherein the modulator receives the output of the comparator to determine, after the high-side switch is turned on and after the expiration of the turn-on time, if an on-pulse, that determines the turn-on time, is sufficient to charge the voltage level on the output supply rail above the reference.

8. The apparatus of claim 7, wherein if the modulator determines that a single on-pulse is sufficient to charge the voltage level on the output supply rail above the reference, the signal is to turn off the high-side switch.

9. The apparatus of claim 8, wherein the modulator determines that if the single on-pulse is insufficient to charge the voltage level on the output supply rail above the reference, a controller keeps the high-side switch turned on until a point when sufficient charge is injected to an output capacitor, coupled to the output supply rail, for the voltage level to cross above the reference.

10. The apparatus of claim 1, wherein at the expiration of the turn-on time, if the voltage level on the output supply rail exceeds the reference, the signal is to turn off the high-side switch.

11. An apparatus, comprising:
    a bridge including a high-side switch and a low-side switch, wherein the low-side switch is coupled in series with the high-side switch;
    an inductor coupled to the bridge;
    a capacitor coupled to the inductor and an output supply rail; and
    a controller to generate a signal to control the high-side switch and the low-side switch such that the high-side switch remains turned on beyond a turn-on time if a voltage level on the output supply rail remains below a reference, wherein the controller receives an output of a comparator to determine, after the high-side switch is turned on and after the turn-on time expires, if an on-pulse, that determines the turn-on time, is sufficient to charge the voltage level on the output supply rail above the reference.

12. The apparatus of claim 11, wherein the comparator is to compare the voltage level on the output supply rail with the reference.

13. The apparatus of claim 10, wherein if the controller determines after the turn-on time expires that the on-pulse is sufficient to charge the voltage level on the output supply rail above the reference, the controller turns off the high-side switch.

14. The apparatus of claim 13, wherein the controller determines that if the on-pulse is insufficient to charge the voltage level on the output supply rail above the reference, the controller keeps the high-side switch turned on until a point when sufficient charge is injected to an output capacitor, coupled to the output supply rail, for the voltage level to cross above the reference.

15. A system, comprising:
    a memory;
    a processor core coupled to the memory; and
    a voltage regulator to power the processor core, wherein the voltage regulator comprises:
       a bridge including a high-side switch and a low-side switch, wherein the low-side switch is coupled in series with the high-side switch;
       a comparator to compare a voltage level on an output supply rail, coupled to the bridge, with a reference;
       a circuitry to generate a turn-on time for an on-pulse; and a modulator to generate the on-pulse to turn on the high-side switch for a duration of the turn-on time and to keep the high-side switch turned on beyond an expiration of the turn-on time if the voltage level on the output supply rail remains below the reference at the expiration of the turn-on time.

16. The system of claim 15, wherein the voltage regulator comprises:
a trans-conductance circuitry coupled to the output supply rail and the reference, wherein an output of the trans-conductance circuitry is coupled to the comparator; and
a capacitor coupled to the output of the trans-conductance circuitry, wherein the trans-conductance circuitry comprises a trans-conductance amplifier.

17. The system of claim 15, wherein the voltage regulator comprises a non-overlap circuitry coupled to an output of the modulator.

18. The system of claim 15, wherein the modulator receives an output of the comparator to determine, after the high-side switch is turned on and after the expiration of the turn-on time, if the on-pulse is sufficient to charge the voltage level on the output supply rail above the reference.

19. The system of claim 18, wherein the modulator determines that if a single on-pulse is sufficient to charge the voltage level on the output supply rail above the reference, the modulator is to turn off the high-side switch.

20. The system of claim 19, wherein the modulator determines that if the on-pulse is insufficient to charge the voltage level on the output supply rail above the reference, a controller keeps the high-side switch turned on until a point when sufficient charge is injected to an output capacitor, coupled to the output supply rail, for the voltage level to cross above the reference.

* * * * *

UNITED STATES PATENT AND TRADEMARK OFFICE
CERTIFICATE OF CORRECTION

| | | |
|---|---|---|
| PATENT NO. | : 11,742,754 B2 | Page 1 of 1 |
| APPLICATION NO. | : 17/069771 | |
| DATED | : October 13, 2020 | |
| INVENTOR(S) | : Anup J. Deka et al. | |

It is certified that error appears in the above-identified patent and that said Letters Patent is hereby corrected as shown below:

In the Claims

Column 26
Line 44 in Claim 13, "The apparatus of claim 10" should read -- The apparatus of claim 11 --

Signed and Sealed this
Ninth Day of July, 2024

Katherine Kelly Vidal
*Director of the United States Patent and Trademark Office*